Jan. 28, 1969 E. O. ERNST ET AL 3,424,629

HIGH CAPACITY EPITAXIAL APPARATUS AND METHOD

Filed Dec. 13, 1965

INVENTORS
ERIC O. ERNST
DONALD J. HURD
GERARD SEELEY
BY
ATTORNEY

United States Patent Office 3,424,629
Patented Jan. 28, 1969

3,424,629

HIGH CAPACITY EPITAXIAL APPARATUS AND METHOD

Eric O. Ernst, Wappingers Falls, N.Y., Donald J. Hurd, Huntington Center, Vt., and Gerard Seeley, Wappingers Falls, N.Y., assignors to International Business Machines Corporation, Armonk, N.Y., a corporation of New York Filed Dec. 13, 1965, Ser. No. 513,427
U.S. Cl. 148—175 9 Claims
Int. Cl. H01l 7/36

ABSTRACT OF THE DISCLOSURE

An epitaxial deposition chamber including preferably a cylindrical rotatable substrate holder having a plurality of circumferential recesses in which the substrates are positioned, means for heating the substrate holder to a desired reaction temperature, a halo-shaped inlet port adjacent one end of the substrate holder for introducing reactant gases into the chamber and outlet ports through which the gas exits from the chamber.

This invention relates to semiconductor fabrication, and more particularly, to an improvement in the epitaxial growth of semiconductor materials.

As is well-known, semiconductor devices are formed of at least two layers of semiconductor material, generally of different conductivity type. These layers are separated by a transition zone required for the purpose of an active device function in an electrical circuit. In most instances the formation of a semiconductor body for ultimate device application is concerned with the creation of a PN junction, and the basic techniques that have been developed for the creation of such junctions are the well-known alloy or fusion technique and the diffusion technique. These two techniques differ in the way an impurity is introduced into a semiconductor wafer at some stage of its processing in order to produce the required altered region of different conductivity.

A third method which has come to the forefront in semiconductor device fabrication during the past decade is a technique known as epitaxial growth. In this technique an additional material is grown upon a monocrystalline wafer of a selected semiconductor, thereby to extend the structure, while retaining in the extension the monocrystallinity of the starting wafer.

Many different processes and reactions have been used in what is generically termed epitaxial growth of semiconductors; for example, various pyrolitic and disproportionation reactions have been employed. The most frequently used of these already developed processes is one involving the hydrogen reduction of silicon tetrachloride at elevated temperature. The method and apparatus of the present invention will be described in this specific context of the hydrogen reduction of silicon tetrachloride, but it will be apparent that other reactions can similarly be utilized. Thus, the method and apparatus of the present invention are not tied to a single reaction or process, or even to a single semiconductor, since the only essential criterion for advantageous application of the instant method and apparatus is that a decomposable vapor source of the semiconductor material of interest be available. In addition to the aforementioned hydrogen reduction of silicon tetrachloride, the pyrolitic decomposition of such tetrachloride could be used, as well as high temperature reactions wherein the high temperature causes interaction between various materials with liberation of the desired atoms of a selected semiconductor.

The epitaxial growth technique shares with the diffusion technique certain attributes such as a facility for broad area layer formation. Epitaxial growth also enables the precise definition, by the use of masking on a substrate, of the required regions for a plurality of semiconductor devices. Unique to epitaxial growth, however, is the concomitant ability to form a layer of a selected uniform conductivity and to define an abrupt junction between a substrate and a layer which has been grown thereon. In contrast therewith, the diffusion technique is limited by the fixed distribution pattern of active impurity atoms within the semiconductor body, this distribution pattern or impurity profile being described by complementary error function curves for the materials and temperatures involved.

This ability of the epitaxial growth technique to produce a uniform conductivity layer is particularly exploited in the formation of epitaxial structures which are later to be processed into a plurality of discrete devices for incorporation ultimately in integrated circuits. Such integrated circuit devices are preferably produced having a $N/N^+$ or $P/P^+$ configuration for their collector regions. This desired configuration stems from the fact that in order to possess structural strength a semiconductor device body must be of substantial thickness. However, since it is generally provided in the fabrication of these device bodies that, when finished, the bulk of the device body will constitute the collector region, this thickness becomes undesirable. Such appreciable thickness for the collector region would cause too high a series resistance in the device. The solution therefore is to utilize a very highly doped substrate having low ohmic resistance as a support means and a very thin moderately doped layer as the active collector region of the device. This is accomplished by taking a very highly doped wafer in the first instance and epitaxially growing thereon, for example, by means of the aforenoted hydrogen reduction of silicon tetrachloride, the required thin layer.

Despite the successes in the application of epitaxial growth techniques, there has been a notable lack of development of suitable apparatus and methods for achieving high capacity outputs that would enable operations on a production scale, as contrasted with those on a laboratory scale. It is not simply a matter of enlarging or enhancing the laboratory scale technique since it is required that operations on a production scale be achieved without compromising epitaxial film uniformity and quality.

Accordingly, it is a primary object of the present invention to achieve high capacity in the formation of semiconductor structures by epitaxial growth.

Another object is to achieve such high capacity with high quality and uniformity in thickness and in resistivity of epitaxial layers.

The above objects are fulfilled in accordance with the present invention by certain unique features of the epitaxial reactor in which the vapor deposition takes place, the crux thereof residing in the geometry for the wafer holder and the technique of heating within the reactor. These features, as well as other subsidiary and attendant features are directed to the achievement of temperature uniformity, gas flow uniformity and autodoping control.

Since film deposition rate is temperature dependent, it is necessary to maintain temperature uniformity over all reacting surfaces if uniform growth is to be achieved. The present invention makes possible the establishment of $\pm 10$ degree uniformity at a temperature of 1200° C. One of the most significant causes for poor layer thickness uniformity can be attributed to uneven gas flow distribution. It is readily evident that in order to achieve equal growth all wafers must be exposed to the same density of reactant gas. This can generally be achieved by insuring a high degree of uniform gas flow distribution within the reactor. It is also advantageous to maintain geometrical symmetry so that all wafers see essentially the gas flow pattern.

Autodoping refers to the process by which dopant atoms escape from the substrate into the gas phase and are ultimately redistributed in the deposited epitaxial layer. This effect causes resistivity gradients in a horizontal-type system as the gas flow passes over a number of wafers in a row. Each wafer is doped by the wafers preceding it. The autodoping effect is minimized in accordance with the present invention by reason of the fact that the wafer holder configuration is such that the gas flow does not pass over more than four or five wafers in a row.

Briefly considered, the epitaxial reactor of the present invention is arranged to realize the aforenoted objects, goals and advantages and comprises a wafer holder in substantially the form of a cylinder having a plurality of recesses in its outer circumference in which the wafers may be placed. More specifically, the wafer holder is a graphite susceptor, rotatably mounted within the reaction chamber, and is heated by means of a helical radio frequency (RF) coil.

The foregoing and other objects, features and advantages of the invention will be apparent from the following more particular description of preferred embodiments of the invention as illustrated in the accompanying drawing.

Figure 1:
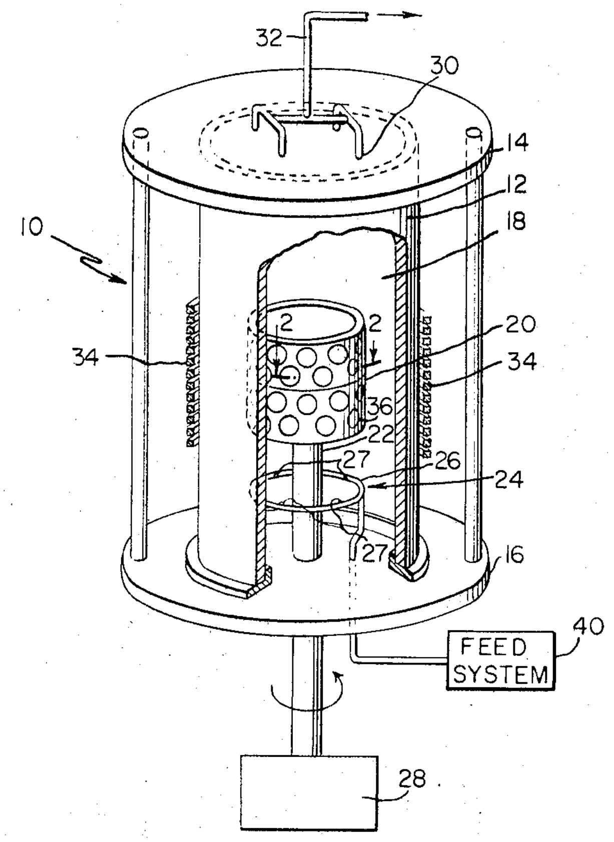
FIG. 1 is a cutaway view of the epitaxial reactor of the present invention.

Referring now to FIG. 1, there is shown apparatus for practicing the technique of the present invention. The reaction that is employed for the epitaxial growth of the required thin layer of silicon material is the basic silicon deposition reaction, described by the equation $$SiCl_4 + 2H_2 \rightleftarrows Si + 4HCl$$

In actuality the reaction is more complex. Depending upon reactant concentrations, temperature, pressure, and reactor geometry, various side reactions can be obtained. Since the reaction is reversible, etching and mass transport processing can also occur.

Figure 2:
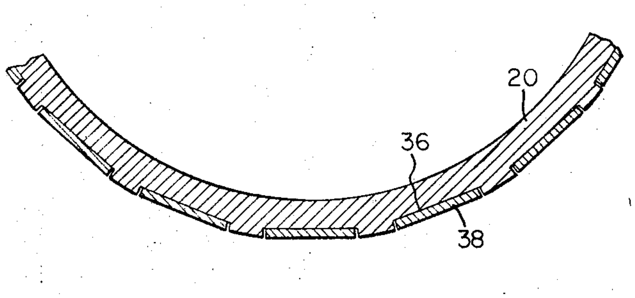
FIG. 2 is a fragmentary view, along the line 2—2 of FIG. 1, of the wafer holder showing the wafers positioned therein.

Referring now to both figures, FIG. 1 is a cutaway view of the epitaxial reactor, and FIG. 2 is a fragmentary view of the wafer holder used therein. The reactor is generally designated by numeral 10 comprising an opaque quartz cylinder 12, which is capped at both ends by plates 14 and 16 made of stainless steel, defining a reaction chamber 18. The lower plate assembly, including a rotary O-ring seal, is attached to a hydraulic cylinder (not shown) that opens and closes the reactor. The wafer holder in the form of a graphite susceptor 20 rests upon a clear fused-quartz rod 22 and moves with the lower plate 16 for loading and unloading. An inlet port 24 is provided adjacent the bottom plate for the introduction of reactant gas, in this case, $SiCl_4$. Input gas flow is distributed within the reactor by means of a halo-shaped quartz tube 26 that has four slots 27 located 90° apart. In this way four equally spaced gas systems are directed up past the rotating susceptor 20. Thus, the rotating susceptor 20 is surrounded with a shower curtain of reactant gas which passes parallel to the surface and over the wafers. The susceptor 20 is rotated by conventional means such as a motor and gear arrangement. The exit gas is exhausted at the top plate 14 through four outlet ports 30 and thence through tubing 32.

An RF generator is used to inductively heat the susceptor 20 to the required temperatures. The generator consists of a 13 turn helical coil 34 which is permanently positioned outside the quartz cylinder 12. It will be noted that this arrangement of a cylindrical load coupled to the helical RF coil 34 provides excellent heating efficiency. Since all points on the circumference of the susceptor 20 are the same distance away from the RF coil 34, temperature uniformity can be readily established in the horizontal direction (within a row of the susceptor 20). To achieve temperature uniformity in a vertical direction (row-to-row) the coil spacings are adjusted. The susceptor 20 is rotated to maintain temperature uniformity circumferentially for each row. With this arrangement one can achieve a temperature uniformity of ±10° at the temperature of 1200° C. (which is the temperature selected for the aforedescribed reaction) over the entire circumferential surface area of the susceptor 20.

The susceptor 20 of cylindrical geometry has typical dimensions of 6⅞ inches in diameter and 5½ inches high. The base material found to be useful is Ultra Carbons UT–6 grade high purity graphite. Since the graphite is only available in 3 inch thick blocks, the susceptor 20 is shown as made up of two sections. Each section contains thirty recesses 36, fifteen in each row. The fifteen position rows in each section are staggered to attain maximum packing density. The 1¼ inch diameter substrate wafers 38 are placed into 1⅜ inches diameter counterbores that are machined into the outer circumference of the susceptor 20 at a 3° angle. The susceptor 20 has a wall thickness of approximately ⅜ inch. This wall thickness represents the best compromise between efficient RF coupling and fast heat-up and cool-down time. The high purity graphite used for the susceptor 20 is preferably sealed before use with an impervious refractory coating such as a vapor-deposited silicon carbide coating.

The radio frequency induction heating that is provided by the coupling from the coil 34 to the susceptor 20 has the following advantages: It is a contactless method that enables one to heat the susceptor from outside the reaction chamber without introducing any contaminants. Also, the walls of the reaction chamber are cold in comparison to the susceptor temperature and this minimizes any out diffusion of impurities from the reaction tube into the reactor. Cold chamber walls also insure that the $SiCl_4$ reduction reaction occurs primarily at the susceptor surface rather than on the walls of the reactor. This is desirable in a manufacturing installation to minimize the need for cleaning. Further advantages reside in the fact that this susceptor can be rotated within the reaction chamber to insure temperature uniformity and increase gas distribution.

The basic procedure in accordance with the technique of the present invention is carried out in the following steps. The wafers 38 are loaded into the susceptor 20. The susceptor 20 is then brought to a temperature of 1200° C. The epitaxial deposition is then begun. The reactant gas $SiCl_4$ is brought in from the feed system 40, shown schematically in FIG. 1. The feed system 40 includes, as is conventional, suitable means such as sources of reactant gases and associated equipment to supply the gases selectively to the reactor. In accordance with the reaction previously described, the $SiCl_4$ is reduced by hydrogen which is the ambient established within the chamber of the reactor 10. Silicon is thereby liberated and is epitaxially deposited in a thin film on the substrate wafers 38. Concurrently therewith a suitable impurity such as phosphorus in the form of $PH_3$ is brought in from the feed system and through the inlet port 24.

Following actual runs which were made in accordance with the previously described technique, uniformity measurements were made. To characterize the uniformity of the system, measurements were made of the thickness and resistivity of $N/N^+$ structures since both parameters can be readily measured by nondestructive techniques. Thickness is measured by the infrared interference technique and resisitvity is characterized by the three point breakdown technique. For a 12 micron medium film thickness, the typical within-wafer standard deviation was ±0.5 micron. Corresponding standard deviation for resistivity was ±0.3 ohm-cm. for a 0.64 ohm-cm. median. This is equivalent to an average percent mean deviation for film thickness and resistivity of ±0.3%.

Measurements were also taken to determine the uniformity achieved within a row of wafers. All 15 wafers therein were measured. The overall standard deviation for thickness and resistivity was ±0.2 micron and ±0.01 ohm-cm. respectively. For a mean thickness of 7.5 microns, the standard deviation within a row was ±0.01 ohm-cm. for a 0.19 ohm-cm. mean. Equivalent uniformity has been achieved on $N/N^+$ and $N/P^+$ epitaxial structures in the resistivity range from 0.1–1.0 ohm-cm. and film thickness from 5–15 microns.

In order to provide the skilled artisan with a complete and detailed procedure that may be adopted for producing epitaxial structures, the following information is herewith furnished but it will be understood that these details do not in any way act as a limitation on the scope of the present invention.

After the wafers have been loaded as previously described, the reaction chamber may be sealed and the pressure checked with argon to assure that the system does not contain any leaks. Susceptor rotation is set at 6 r.p.m. Argon is then passed through the reaction chamber at a flow rate of 10 liters/min. for 9 minutes to purge the oxygen and atmospheric gases from the chamber. The oxygen concentration is thereby reduced below 4% so that hydrogen can then be safely admitted. Then the reactor is purged with hydrogen at a flow rate of 25 liters/min. for ten minutes to displace the argon and establish a total hydrogen ambient for the epitaxial reaction. After the susceptor has been brought to 1200° C., the wafers are etched in hydrogen for fifteen minutes at 1200° C. to remove surface oxides prior to growth. Just before the deposition is to begin, the $SiCl_4$ and $PH_3$ flows are vented to purge the feed system and establish equilibrium flows before they are injected into the reactor. After deposition is completed the wafers are kept at 1200° C. for three minutes. All excess reactant gases are purged from the reactor with hydrogen. RF power is turned off, and the wafers are cooled in hydrogen for ten minutes. The wafers are then further cooled in argon which also purges the hydrogen from the reactor before it is opened to the atmosphere. The reactor is opened, and the wafers are unloaded from the susceptor. Total running time for a typical run was 1¼ hours.

A summary of the deposition parameters is given below:

(1) Deposition temperature—1200° C.

(2) $SiCl_4/H_2$ mole ratio—0.02.

(3) Growth rate—approx. 0.8 micron/minute.

(4) Total hydrogen flow rate—25 l./min.

(5) Gas velocity past wafers approx.—2.5 cm./sec.

(6) Dopant flow from 25 p.p.m. $PH_3$ in hydrogen source—5–18 cc./min. (dependent upon resistivity specification).

(7) Time of deposition—6–14 minutes (dependent upon thickness specification).

(8) Susceptor rotation rate—6 r.p.m.

In summary, what has been disclosed is a novel epitaxial growth technique and apparatus by which high capacity production of semiconductor wafers can be realized. A versatile epitaxial reactor has been described which produces epitaxial material of high quality and excellent uniformity. Such reactor includes a cylindrical or barrel-shaped graphite susceptor whose configuration assures temperature uniformity, gas flow uniformity and virtually eliminates gross surface imperfections in the epitaxial film. This epitaxial reactor with its unique susceptor configuration and associated apparatus is considered as capable of replacing other reactors as a standard production tool in integrated circuit manufacture.

While there have been shown and described and pointed out the fundamental novel features of the invention as applied to the preferred embodiments, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. The method of forming by vapor deposition a plurality of semiconductor bodies having a layer of semiconductor material grown onto a substrate which comprises the steps of, placing a plurality of wafers of single crystal semiconductor material having a predetermined conductivity type in spaced recesses formed in substantially the entire circumferential surface of revolution of a rotatable, substrate holder within a reaction chamber, rotating said substrate holder, heating said wafers to a reaction temperature required for the vapor deposition of a layer thereon, introducing a combined vapor comprising semiconductor atoms and impurity atoms into said chamber and decomposing said combined vapor over said wafers.

2. The method in accordance with claim 1, wherein said grown layer has a conductivity different from that of said wafers.

3. The method in accordance with claim 1, wherein said semiconductor material is silicon and wherein said decomposable vapor comprising silicon atoms is $SiCl_4$.

4. Apparatus for the formation by vapor deposition of layers of material upon substrates comprising a reactor including means for defining a reaction chamber, a substrate holder having spaced recesses formed in substantially its entire circumferential surface of revolution in which said substrates are positioned, means for rotating said substrate holder within said chamber, means for uniformly heating said substrate holder to a predetermined reaction temperature, means for flowing reactant gases within said chamber over said wafers, including a halo-shaped inlet port adjacent one end of said substrate holder, and outlet ports through which said reactant gas exits from said chamber.

5. Apparatus as defined in claim 4, wherein said substrate holder is a graphite susceptor.

6. Apparatus as defined in claim 4, wherein said means for heating includes an RF coil positioned outside said chamber for inductively coupling heat to said graphite susceptor.

7. In a process of forming by vapor deposition a plurality of semiconductor bodies having a thin layer of semiconductor material grown onto a substrate where a source of reactant gas is flowed at a preselected temperature over a plurality of wafers, the improvement which comprises rotating a substrate holder in said flow, said substrate holder having spaced recesses formed in substantially its entire circumferential surface of revolution for accommodating wafers.

8. In a process wherein the improvement is as defined in claim 7, but further including the step of inductively coupling heat to said substrate holder, said substrate holder being a graphite susceptor.

9. The improvement as defined in claim 8 including a halo-shaped inlet port having four slots spaced 90° apart.

References Cited

UNITED STATES PATENTS

| | | | |
|---|---|---|---|
| 3,220,380 | 11/1965 | Schaarschmidt | 118—48 |
| 3,233,578 | 2/1966 | Capita | 117—106 X |
| 3,301,213 | 1/1967 | Grochowski | 117—106 X |

HYLAND BIZOT, *Primary Examiner.*

R. LESTER, *Assistant Examiner.*

U.S. Cl. X.R.

148—174; 117—106; 118—48, 49, 49.1, 49.5